(12) United States Patent
Oda (10) Patent No.: US 8,304,977 B2
(45) Date of Patent: Nov. 6, 2012

(54) LIGHT EMITTING DEVICE AND ELECTRONIC DEVICE

(75) Inventor: Toshihiro Oda, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 43 days.

(21) Appl. No.: 12/907,256

(22) Filed: Oct. 19, 2010

(65) Prior Publication Data

US 2011/0095675 A1    Apr. 28, 2011

(30) Foreign Application Priority Data

Oct. 23, 2009  (JP) .................... 2009-244177

(51) Int. Cl.
  *H01L 51/50*    (2006.01)
(52) U.S. Cl. ........................ 313/499; 313/504
(58) Field of Classification Search .............. 313/504, 313/498–499
  See application file for complete search history.

(56) References Cited

U.S. PATENT DOCUMENTS 5,554,911 A    9/1996  Nakayama et al.
7,218,049 B2 *  5/2007  Yamada et al. ............. 313/506
8,076,687 B2 * 12/2011  Kobayashi et al. ............ 257/98

FOREIGN PATENT DOCUMENTS

JP    B2-2797883    7/1998
JP    A-2008-218081    9/2008

* cited by examiner

*Primary Examiner* — Anh Mai
*Assistant Examiner* — Hana Featherly
(74) *Attorney, Agent, or Firm* — Oliff & Berridge, PLC (57) ABSTRACT

A light emitting device includes a light emitting element having a first electrode layer, a second electrode layer, and a light emitting layer disposed between the first electrode layer and the second electrode layer above a substrate, a reflection layer which is disposed between the substrate and the first electrode layer and reflects light emitted by the light emitting layer toward the light emitting layer, a semi-transparent semi-reflective layer which is disposed above the light emitting layer and reflects a portion of light emitted by the light emitting layer toward the light emitting layer, and transmits the other portion of the light, and a reflection enhancing layer which is disposed on the semi-transparent semi-reflective layer and includes a first layer having a refractive index higher than a refractive index of the semi-transparent semi-reflective layer, the first layer being in contact with the semi-transparent semi-reflective layer.

8 Claims, 9 Drawing Sheets

|  |  | EXPERIMENTAL EXAMPLE | COMPARATIVE EXAMPLE |
|---|---|---|---|
| COLOR PURITY | CIE1931x | 0.140 | 0.134 |
|  | CIR1931y | 0.053 | 0.062 |
| NORMALIZED EXTERNAL QUANTUM EFFICIENCY | | 1.7 | 1.0 |

LIGHT EMITTING DEVICE AND ELECTRONIC DEVICE

BACKGROUND

1. Technical Field

The present invention relates to a light emitting device and an electronic device which include an organic electro luminescent (EL) element, and the like.

2. Related Art

An organic light emitting diode (OLED), that is, an organic electro luminescent (EL) element attracts attention as a thin light emitting source which is light in weight, and an image display apparatus including a large number of organic EL elements has been developed. The organic EL element has a configuration in which at least one layer of organic thin film formed with an organic material is sandwiched between a pixel electrode and an opposite electrode.

In a field of the organic EL element, a technique of intensifying light having a specific wavelength among emitted lights by utilizing constructive interference, or resonance has been known. With the technique, color purity of emission colors or efficiency of output light with respect to emitted light can be enhanced.

As such image display apparatuses, those disclosed in Japanese Patent No. 2797883 and JP-A-2008-218081 have been known, for example.

However, the following problems arise in the techniques disclosed in Japanese Patent No. 2797883 and JP-A-2008-218081.

That is to say, with the technique disclosed in Japanese Patent No. 2797883, light having a specific wavelength can be intensified with an action by "Micro-Optical Resonator" ((0015), (0018) and so on in Japanese Patent No. 2797883). However, means for enhancing the action, that is, means for effectively utilizing the resonance action by the optical resonator is not particularly described in Japanese Patent No. 2797883 except for the following point. That is, only an innovation relating to reflectance of a semi-transparent reflective layer is described ((0016) in Japanese Patent No. 2797883).

Further, with the technique disclosed in JP-A-2008-218081, it is considered that an effect of intensifying light having a specific wavelength with an action by an optical resonator can be also obtained ((0028) and so on in JP-A-2008-218081) as in the technique disclosed in Japanese Patent No. 2797883. However, in the technique, it is assumed that a film of a transparent electrode is formed so as to be in contact with an organic compound layer. This arises a problem that there is a large risk of causing some damage on the organic compound layer when the film of the transparent electrode is formed during a manufacturing process (see, claim 1, FIG. 1 and so on in JP-A-2008-218081). Further, it is considered that an amount of light reflection by an interface between a transparent cathode electrode 14 and an optical path length adjustment layer 15 in JP-A-2008-218081 is limited. Therefore, the resonance action by the optical resonator is not effectively utilized likely in Japanese Patent No. 2797883.

SUMMARY

An advantage of some aspects of the invention is to provide a light emitting device and an electronic device which can solve at least one of the issues mentioned above.

A light emitting device according to an aspect of the invention includes a light emitting element having a first electrode layer, a second electrode layer, and a light emitting functional layer disposed between the first electrode layer and the second electrode layer above a substrate, a reflection layer which is disposed between the substrate and the first electrode layer and reflects light emitted by the light emitting functional layer toward the light emitting functional layer, a semi-transparent semi-reflective layer which is disposed above the light emitting functional layer and reflects a portion of light emitted by the light emitting functional layer toward the light emitting functional layer, and transmits the other portion of the light, and a reflection enhancing layer which is disposed on the semi-transparent semi-reflective layer and includes a first layer having a refractive index higher than a refractive index of the semi-transparent semi-reflective layer, the first layer being in contact with the semi-transparent semi-reflective layer.

According to the aspect of the invention, the first layer which is in contact with the semi-transparent semi-reflective layer and is included in the reflection enhancing layer is provided, and a refractive index of the first layer is higher than a refractive index of the semi-transparent semi-reflective layer. Therefore, relatively strong light reflection may occur at an interface between the first layer and the semi-transparent semi-reflective layer. Accordingly, in a configuration according to the aspect of the invention, an absolute amount of light returning into an optical resonator formed with the semi-transparent semi-reflective layer and the reflection layer among light generated in the light emitting functional layer is relatively large. This makes it possible to intensify an action of the optical resonator, in other words, to effectively utilize the resonance action by the optical resonator.

In the light emitting device according to the aspect of the invention, it is preferable that the semi-transparent semi-reflective layer include the second electrode layer and functions as a cathode.

According to the aspect of the invention, the semi-transparent semi-reflective layer includes the entire or a portion of the second electrode layer. In other words, the semi-transparent semi-reflective layer and the entire or the portion of the second electrode layer are commonly used or simultaneously used. Therefore, a device configuration is made simple and efficient and easiness in manufacturing is improved.

Further, in the aspect of the invention, a transparent electrode is not required to be manufactured so as to be in contact with the light emitting functional layer unlikely in the existing technique if a manufacturing method in which the layers are sequentially laminated on the substrate is employed. Therefore, there is little risk of causing some damage on the light emitting functional layer through the manufacturing process.

Meanwhile, in the light emitting device according to the aspect of the invention, it is preferable that the reflection enhancing layer include, in addition to the first layer, a (2n)th layer having a refractive index lower than a refractive index of the first layer (n is a positive integer), and a (2n+1)th layer having a refractive index higher than a refractive index of the (2n)th layer, a second layer in the (2n)th layer is in contact with the first layer, and the (2n)th layer is in contact with the (2n+1)th layer.

According to the aspect of the invention, the reflection enhancing layer is formed with the odd number layers. Then, the refractive index changes between the layers from high to low or from low to high. Therefore, according to the aspect of the invention, relatively strong light reflection occurs at an interface between the semi-transparent semi-reflective layer and the first layer, an interface between the first layer and the second layer, and an interface between the (2n)th layer and the (2n+1)th layer. As a result, according to the aspect of the invention, effects according to the above aspect of the invention can be obtained more effectively.

As is obvious from the above definition, in the aspect of the invention, the number of layers forming the reflection enhancing layer is not limited specifically as long as the reflection enhancing layer is formed with the odd number layers. It is needless to say that as the number of layers becomes too large, there arises a risk that various troubles such as deterioration in light transmissive property or reduction in manufacturing easiness are caused. From this point, the number of layers to be included in the reflection enhancing layer is preferably defined so as to prevent the troubles from occurring on the assumption that a reflection enhancement action to be realized is achieved. To be more specific, a configuration in which the n is 1, that is, the reflection enhancing layer is formed with three layers in total is the most preferable example.

Further, in the light emitting device according to the aspect of the invention, it is preferable that an optical distance from the reflection layer to an interface of the semi-transparent semi-reflective layer, which is opposed to the reflection layer, be defined based on "d" calculated from an expression (i):

$$d = ((2\pi m + \phi_D + \phi_U)/4\pi) \cdot \lambda \quad (i)$$

In the expression, $\lambda$ indicates a wavelength set as a resonance subject, $\phi_D$ indicates a phase change when light having the wavelength $\lambda$ traveling from the side of the light emitting functional layer toward the reflection layer is reflected by the reflection layer, $\phi_U$ indicates a phase change when light having the wavelength $\lambda$ traveling from the side of the light emitting functional layer toward the semi-transparent semi-reflective layer is reflected by the semi-transparent semi-reflective layer, and m is a positive integer.

According to the aspect of the invention, resonance phenomenon can be preferably caused in the configuration of the resonator formed with the light emitting element, the reflection layer and the semi-transparent semi-reflective layer.

A case where there are a plurality of the light emitting elements and three colors of red, green, and blue (RGB) are displayed in the light emitting device according to the aspect of the invention is considered, for example. In this case, a wavelength for each of the three colors may be substituted into "wavelength set as a resonance subject" (hereinafter, also referred to as "resonance subject wavelength") which is referred in the aspect of the invention. That is to say, if the wavelengths of the three colors are assumed to be $\lambda r$, $\lambda g$, and $\lambda b$, $\lambda$ may be any one of $\lambda r$, $\lambda g$, and $\lambda b$. Therefore, "d" may be a specific value such as dr, dg or db in accordance with each of $\lambda r$, $\lambda g$, and $\lambda b$ (accordingly, in this case, a value corresponding to "d" may be different in each of the light emitting elements).

Further, in the aspect of the invention, in order to realize three color display and the like as described above, it is preferable that the light emitting device further include "a color filter which is arranged at an opposite side of the light emitting functional layer with respect to the semi-transparent semi-reflective layer, sandwiching the semi-transparent semi-reflective layer therebetween, and transmits light transmitted through the semi-transparent semi-reflective layer". In this case, the resonance subject wavelength $\lambda$ can be set to be "wavelength corresponding to a peak of the transmittance of the color filter".

Further, in order to solve the above issues, an electronic device according to another aspect of the invention includes the above various types of light emitting devices.

The electronic device according to the aspect of the invention includes the above various types of light emitting devices. Therefore, an electronic device in which an action of the optical resonator can be obtained more desirably, in other words, improvement effect of color purity and the like can be effectively obtained is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment according to the invention is described with reference to FIG. 1 and FIG. 2. In drawings referred in the following description in addition to FIG. 1 and FIG. 2 described here, a dimension ratio of each member is appropriately made different from a practical dimension ratio thereof in some case.

Cross-Sectional Configuration of Organic EL Device

Figure 1:
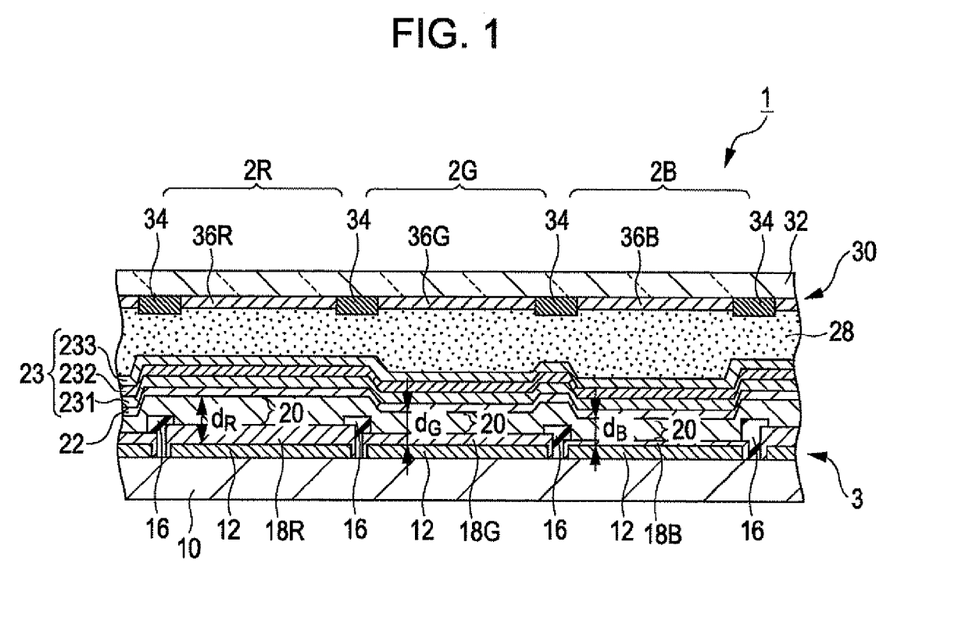
FIG. 1 is a cross-sectional view illustrating a schematic configuration of a light emitting device according to an embodiment of the invention.

FIG. 1 is a cross-sectional view illustrating a schematic configuration of an organic EL device (light emitting device) 1 according to an embodiment of the invention. The organic EL device 1 includes a light emitting panel 3 and a color filter panel 30.

As shown in FIG. 1, the light emitting panel 3 includes a plurality of light emitting elements (pixels) 2 (2R, 2G, and 2B). The organic EL device 1 according to the embodiment is used as a full-color image display apparatus. The light emitting element 2R indicates a light emitting element from which red light is output. The light emitting elements 2G and 2B indicate light emitting elements from which green light and blue light are output, respectively.

A thin film transistor (TFT) for supplying power, wiring lines and the like are connected to each of the light emitting elements 2. The TFT, the wiring lines, and the like are arranged between appropriate interlayer insulation films on a substrate 10, for example.

Note that the TFT, the wiring lines, and the like are not shown in FIG. 1 for easy understanding of the drawing and the like. Further, the intermediate insulation films can be formed between reflection layers 12 and first electrode layers 18, between the reflection layers 12 and the substrate 10 which will be described later, or other various locations. However, the intermediate insulation films are also not shown. Further, although only three light emitting elements 2 are shown in FIG. 1, a larger number of light emitting elements than those shown in FIG. 1 are provided practically. Hereinafter, R, G, and B which are added to constituent components correspond to the light emitting elements 2R, 2G, and 2B, respectively.

The light emitting panel 3 as shown in FIG. 1 is a top emission type. The light emitting panel 3 has the substrate 10. The substrate 10 may be formed with a transparent material such as a glass or an opaque material such as a ceramics or a metal.

The reflection layers 12 having a uniform thickness are formed on the substrate 10 at least at positions where the reflection layers 12 are superimposed with the light emitting elements 2. Each reflection layer 12 is formed with a material having a high reflectance such as aluminum (Al), chrome (Cr), silver (Ag), or alloys including these materials. The reflection layers 12 reflect light traveling from the light emitting elements 2 (including light emitted by the light emitting elements 2) in the upper direction in FIG. 1.

It is to be noted that in addition to the above Al, Cr, and Ag, Cu, Zn, Nd, Pd, and the like may be added to the reflection layers 12. This may improve heat resistance of the reflection layers 12.

The thickness of each reflection layer 12 is preferably set to approximately 50 through 150 nm.

Separation walls (separators) 16 which divide the light emitting elements 2 are formed on the substrate 10. Each separation wall 16 is formed with an insulation resin material, such as acryl, epoxy or polyimide.

Each light emitting element 2 has a first electrode layer 18, a second electrode layer 22, and a light emitting functional layer 20 arranged between the first electrode layer 18 and the second electrode layer 22.

In the embodiment, the first electrode layers 18 (18R, 18G, and 18B) are pixel electrodes each of which is provided on each of the pixels (light emitting elements 2). For example, each first electrode layer 18 is an anode. Each first electrode layer 18 is formed with a transparent material such as indium tin oxide (ITO) or $ZnO_2$, for example. The thicknesses of the first electrode layers 18 are different from each other depending on emission colors. That is to say, the first electrode layers 18R, 18G, and 18E have thicknesses which are different from each other. This point is described in detail in a section "Light Reflection and Transmission Model" below.

In the embodiment, the light emitting functional layer 20 is commonly formed over the plurality of light emitting elements 2. Further, the light emitting functional layer 20 has a uniform thickness regardless of emission colors of the light emitting elements 2. The light emitting functional layer 20 has at least an organic light emitting layer. The organic light emitting layer emits white light if a current is flown to the organic light emitting layer. That is to say, the organic light emitting layer emits light having light components of red, green, and blue. The organic light emitting layer may be a single layer or may be formed by a plurality of layers. For example, the organic light emitting layer may be formed by a blue light-emitting layer which mainly emits blue light if a current is flown thereto and a yellow light-emitting layer which emits light including red and green if a current is flown thereto.

The light emitting functional layer 20 may have a hole transporting layer, a hole injecting layer, an electron block layer, a hole block layer, an electron transporting layer, an electron injecting layer, and the like in addition to the organic light emitting layer. Among these layers, the hole injecting layer is made of HI-406 (manufactured by Idemitsu Kosan Co., Ltd.) or copper phthalocyanine (CuPc), for example. The hole transporting layer is made of α-NPD (N,N'-di(1-naphthyl)-N,N'-diphenyl-1,1'-biphenyl-4,4'-diamine) or the like. The electron transporting layer is made of aluminum quinol complex (Alq3) or the like. The electron injecting layer is made of LiF or the like.

The second electrode layer (semi-transparent semi-reflective layer) 22 is formed with an alloy or a metal, such as MgAl, MgCu, MgAu, and MgAg, for example. In the embodiment, the second electrode layer 22 is a common electrode which is commonly provided over the plurality of pixels (light emitting elements). For example, the second electrode layer 22 is a cathode.

The second electrode layer 22 has a uniform thickness regardless of emission colors of the light emitting elements 2. To be more specific, the second electrode layer 22 may have preferably a thickness of approximately 5 to 20 nm, for example. The second electrode layer 22 has a semi-transparent semi-reflective property since the thickness thereof is relatively small.

The second electrode layer 22 having such configuration transmits a portion of light traveling from the light emitting functional layer 20 (including light emitted by the light emitting functional layer 20) in the upper direction in FIG. 1. Then, the second electrode layer 22 reflects the other portion of the light in the lower direction in FIG. 1, that is, toward the first electrode layers 18.

The light emitting functional layer 20 is in contact with the first electrode layers 18 in an opening (pixel opening) formed between the plurality of separation walls 16. In one light emitting element 2, if a current is flown between the first electrode layer 18 and the second electrode layer 22, a hole is supplied to the light emitting functional layer 20 of the light emitting element 2 from the first electrode layer 18 and an electron is supplied to the light emitting functional layer 20 of the light emitting element 2 from the second electrode layer 22. Then, the hole and the electron are recombined so as to generate an exciton. When the exciton is transitioned to a ground state, the exciton outputs energy, in other words, light emission phenomenon occurs. Accordingly, light emitting regions of the light emitting elements 2 are roughly defined by the pixel openings formed between the separation walls 16. Namely, the pixel openings of the separation walls 16 divide the light emitting elements 2.

The light emitting functional layer 20 emits white light. However, when the light reciprocates between the reflection layer 12 and the second electrode layer 22, each of the light emitting elements 2 outputs light obtained by amplifying light having a specific wavelength. That is to say, in the light emitting element 2R, light having a red wavelength is amplified and output. In the light emitting element 2G, light having a green wavelength is amplified and output. In the light emitting element 23, light having a blue wavelength is amplified and output. For the purpose of this, optical distances d ($d_R$, $d_G$, and $d_B$) between the reflection layers 12 and the second electrode layer 22 are made different from each other in the light emitting element 2R, 2G, and 2B. It is to be noted that reference symbols d ($d_R$, $d_G$, and $d_B$) in FIG. 1 indicate optical distances and do not indicate practical distances. This point will be described in detail in a section "Light Reflection and Transmission Model" below.

A reflection enhancing layer 23 is formed above the second electrode layer 22 in FIG. 1.

As shown in FIG. 1, the reflection enhancing layer 23 includes a first high refractive index layer 231, a low refractive index layer 232, and a second high refractive index layer 233. The layers (231, 232, and 233) are laminated in this order from the lower side in FIG. 1. Meanings of "high" and "low" included in the terminologies of each of the layers (231, 232, and 233) are as follows. That is, the first high refractive index layer 231 has a relatively high refractive index in comparison with that of the second electrode layer 22. The low refractive index layer 232 has a relatively low refractive index in comparison with that of the first high refractive index layer 231. The second high refractive index layer 233 has a relatively high refractive index in comparison with that of the low refractive index layer 232. In short, it can be considered that high-low of a refractive index of a layer which is located at an upper side in FIG. 1 is defined by a relative relationship with respect to a refractive index of a layer which is located at a position immediately below the above layer.

To be more specific, the first high refractive index layer 231 may be made of Alq3, SiN, SiON, or the like, for example. These materials have refractive indexes of equal to or not less than 1.6 for light at a wavelength of 555 nm. The same holds for the second high refractive index layer 233.

Further, the low refractive index layer 232 may be made of LiF, $LiO_2$, or the like, for example. These materials have refractive indexes of equal to or not more than 1.5 for light at a wavelength of 555 nm.

The thickness of each of the layers (231, 232, and 233) is preferably set to approximately 50 through 90 nm as specific numerical values, for example.

The color filter panel 30 is bonded to the light emitting panel 3 with a transparent adhesive agent 28. The color filter panel 30 includes a substrate 32 formed with a transparent material such as a glass, black matrixes 34 formed on the substrate 32, and color filters 36 (36R, 36G, and 36B) arranged at openings which are formed on the black matrixes 34.

The adhesive agent 28 holds both of the color filter panel 30 and the light emitting panel 3 such that the substrate 32 and the color filters 36 of the color filter panel 30 and the layers of the light emitting panel 3 keep a substantially parallel relationship.

The color filters 36 are arranged at the positions where the color filters 36 are superimposed with the light emitting elements 2, in particular, the first electrode layers 18. The color filters 36 are arranged at an opposite side of the light emitting functional layer 20 with respect to the second electrode layer 22 having semi-transparent semi-reflective property, sandwiching the second layer 22 having semi-transparent semi-reflective property therebetween. The color filters 36 transmit light transmitted through the second electrode layer 22 of the superimposed light emitting elements 2.

The color filter 36R is superimposed with the light emitting element 2R so that one color filter 36R and one light emitting element 2R form one pair. The color filter 36R has a function of transmitting red light. The peak of the transmittance of the color filter 36R is obtained at a wavelength of 610 nm. The color filter 36R transmits red light among lights which has been transmitted through the second electrode layer 22 of the superimposed light emitting elements 2R and in which red light has been amplified so as to enhance purity of red. Further, the color filter 36R absorbs a large amount of green and blue lights.

The remaining color filters 36G and 36B basically have the same configuration as the color filter 36R except that the color filters 36G and 36B transmit green light and blue light, respectively. The peak of the transmittance of the color filter 36G is obtained at a wavelength of 550 nm and the peak of the transmittance of the color filter 36B is obtained at a wavelength of 470 nm.

Light Reflection and Transmission Model

Figure 2:
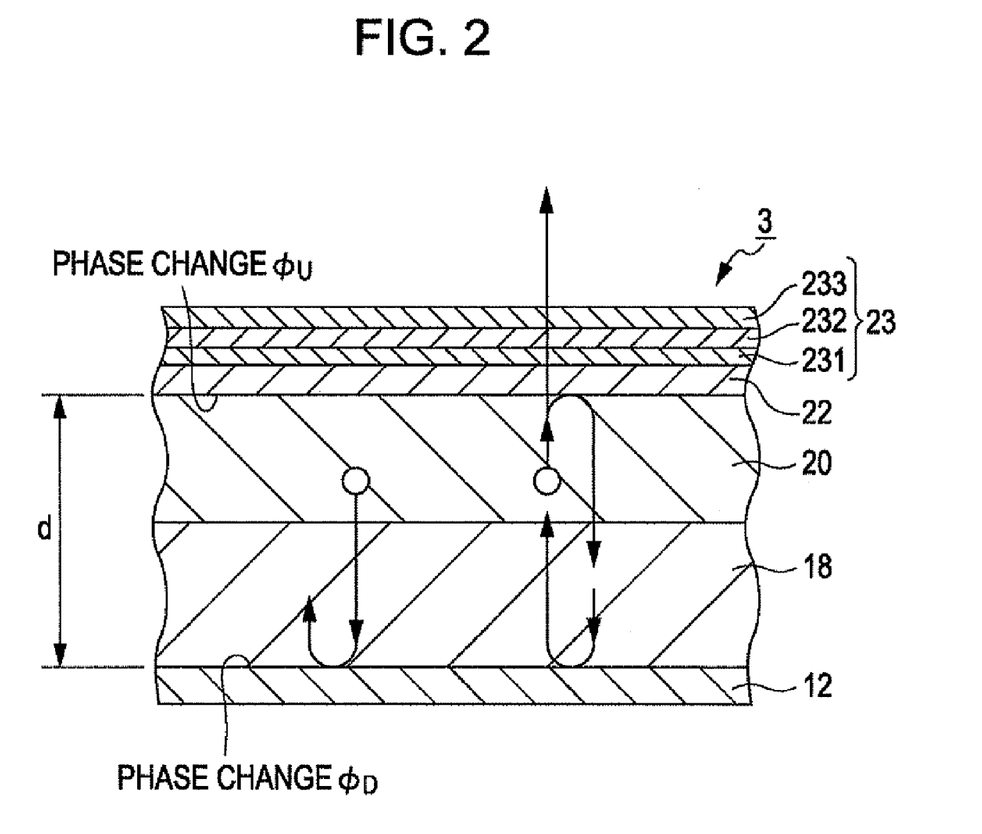
FIG. 2 is a diagram schematically illustrating a locus of light in a resonator mechanism in the light emitting device in FIG. 1 in a simplified manner.

FIG. 2 is a diagram schematically illustrating a locus of light emitted from the light emitting functional layer 20 in a simplified manner. A portion of light emitted from the light emitting functional layer 20 travels toward the side of the first electrode layer 18 as shown in the left side in FIG. 2 and is reflected by a surface of the reflection layer 12 at the side of the light emitting functional layer 20. The phase change at the time of the reflection is assumed to be $\phi_D$. On the other hand, the other portion of the light travels toward the side of the second electrode layer 22 as shown in the right side in FIG. 2 and is reflected by a surface of the second electrode layer 22 at the side of the light emitting functional layer 20 (interface of the second electrode layer 22, which is opposed to the reflection layer 12). The phase change at the time of the reflection is assumed to be $\phi_U$.

In the latter case, that is, in a case where light is reflected by the second electrode layer 22, the light transmits through the light emitting functional layer 20 and the first electrode layer 18 after the reflection and is reflected by a surface of the reflection layer 12 at the side of the light emitting functional layer 20 again as shown in FIG. 2. Hereinafter, reflection of light is infinitely repeated by the second electrode layer 22 and the reflection layer 12 in principle. In the former case, that is, in a case where light is reflected by the reflection layer 12, the same is true although not shown.

Change of optical paths due to refractions of the light on the interfaces is not shown and the optical paths are shown with simple straight lines or curved lines in FIG. 2.

In the embodiment, the optical distance d as shown in FIG. 2 (or FIG. 1) is defined by the following expression (1) on the assumption that the above-described reflection phenomenon occurs.

$$d=((2\pi m+\phi_D+\phi_U)/4\pi)\cdot\lambda \quad (1)$$

In the expression (1), o indicates a wavelength (nm) set as a resonance subject and m indicates an arbitrary integer. Note that indications of $\phi_D$ and $\phi_U$ are as described earlier.

In the embodiment, as is also obvious from FIG. 1, the above λ and d are defined for each of the light emitting elements 2R, 2G, and 2B. To be more specific, each of the light emitting elements 2R, 2G, and 2B forms a pair together with each of the color filter 36R, 36G, and 36B as described above. Therefore, each wavelength corresponding to a peak of a transmittance of each of the color filter 36R, 36G, and 36B (that is, $\lambda_R$=610 nm, $\lambda_G$=550 nm, and $\lambda_B$=470 nm as described above) can be set as (or substituted into) the wavelength λ. Each of the $d_R$, $d_G$, and $d_B$ (see, FIG. 1) corresponding to each of $\lambda_R$, $\lambda_G$, and $\lambda_B$ is obtained as the optical distance d. At the time of root-findings of $d_R$, $d_G$, and $d_B$, a value corresponding to each of $\lambda_R$, $\lambda_G$, and $\lambda_B$ ($\phi_D=\phi_{DR}$, $\phi_{DG}$, $\phi_{DB}$, or, $\phi_U=\phi_{UR}$, $\phi_{UG}$, $\phi_{UB}$) is used for each of $\phi_D$ and $\phi_U$ in the expression (1).

In order to realize $d_R$, $d_G$, and $d_B$ obtained by the expression (1) in the practical apparatus, the thicknesses of the first electrode layers 18 (18R, 18G, and 18B) are adjusted for each of the light emitting elements 2 (2R, 2G, and 2B) as shown in FIG. 1 in the embodiment.

In general, an "optical distance" for one substance is represented as a product of a physical thickness of the substance and a refractive index thereof. Therefore, if it is assumed that the physical thickness of each of the first electrode layers 18 is t, the refractive index thereof is $n_{18}$, the entire optical distance D of each of the first electrode layers 18 and the light emitting functional layer 20 is represented by the following expression.

$$D = t \cdot n_{18} + D_{20} \quad (2)$$

$D_{20}$ indicates an optical distance of the light emitting functional layer 20.

In the expression (2), since the refractive index $n_{13}$ is not basically changed, t is needed to be varied in order to satisfy any one of expressions $D=d_R$, $D=d_G$, and $D$ $d_B$. Thus, $t_R$ when the expression $D=d_R$ is satisfied, $t_G$ when the expression $D=d_G$ is satisfied and $t_B$ when the expression $D=d_B$ is satisfied can be obtained. The thicknesses of the first electrode layers 18 are adjusted based on these values. At the time of root-findings of $t_R$, $t_G$, and $t_B$, a value corresponding to each of $\lambda_R$, $\lambda_G$, and $\lambda_B$ ($n_{18}=n_{18R}$, $n_{18G}$, $n_{18B}$) is used for $n_{18}$ in the expression (2).

In such a manner, the optical distance relating to an optical resonator is adjusted through the adjustment of the thicknesses of the first electrode layers 18 in the embodiment. However, the invention is not limited to the mode. For example, the optical distance relating to the optical resonator may be adjusted through adjustment of the thickness of the light emitting functional layer 20 or adjustment of the thickness of each of the layers such as the above hole injecting layer, which forms the light emitting functional layer 20, instead of or in addition to the adjustment of the thicknesses of the first electrode layers 18.

As described above, the optical resonator is constituted by the light emitting functional layer 20, the reflection layers 12 and the second electrode layer 22 in the embodiment. That is to say, light emitted from the light emitting functional layer 20 is repeatedly reflected by the reflection layer 12 and the second electrode layer 22. Therefore, only light having a specific wavelength is subjected to constructive interference or is involved in resonance phenomenon.

For example, the optical distance $d_R$ of the light emitting element 2R is defined by the above expression (1). Therefore, resonance phenomenon for light having the wavelength $\lambda_R$ occurs in the light emitting element 2R. Then, a portion of the thus amplified light having the wavelength 4 (that is, red light) travels to the outside of the device since the second electrode layer 22 has semi-transmissive property (see, an arrow extending in the upper direction beyond the second electrode layer 22 in FIG. 2). As a result, red is intensified.

The same holds for green and blue.

Operation Effect of Organic EL Device

Hereinafter, operation effects of the organic EL device 1 including the above configuration are described with reference to FIGS. 3 to 8 in addition to FIG. 1 and FIG. 2 which has been already referred to.

Figure 3:
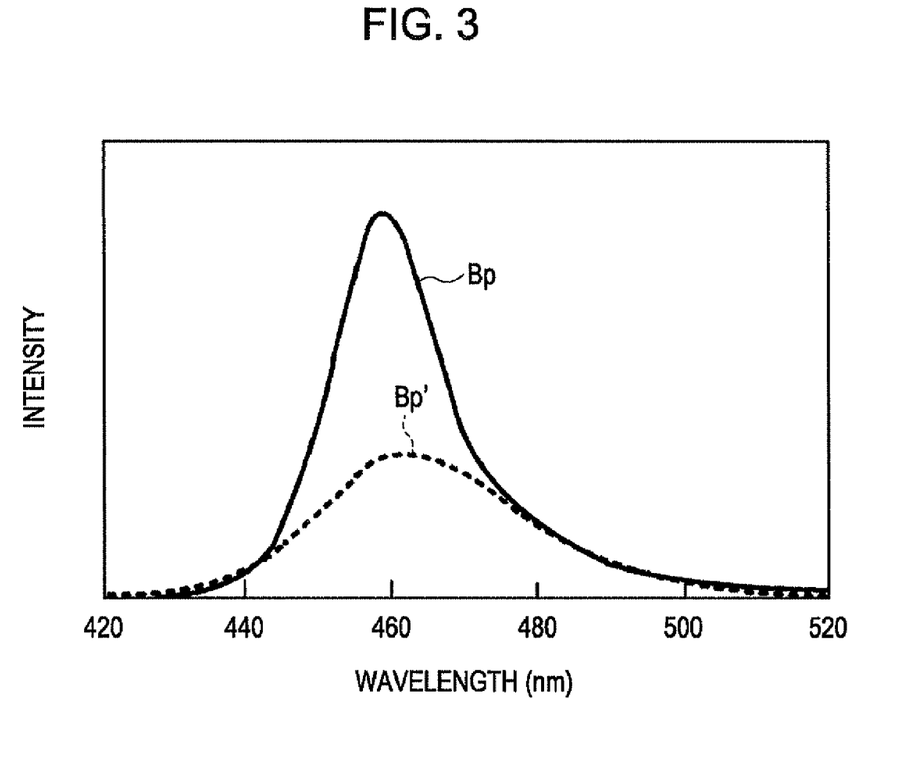
FIG. 3 is a graph illustrating an experimental result of a spectrum of light emitted from the light emitting device in FIG. 1.
Figure 4:
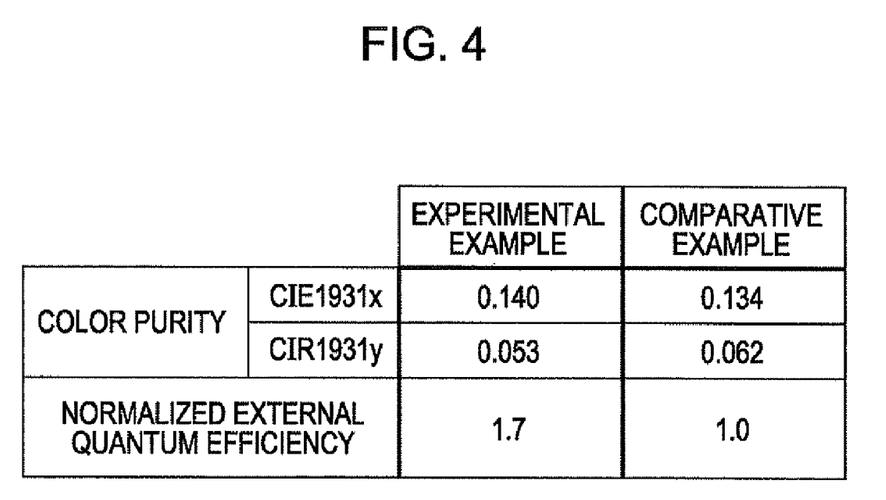
FIG. 4 is a table illustrating improvement effect of color purity and improvement effect of normalized external quantum efficiency by the light emitting device in FIG. 1 with specific numerical values.

At first, FIG. 3 and FIG. 4 illustrate various types of experimental results such as an observation result of light intensity observed in the organic EL device 1. The experimental results are obtained by practically manufacturing the organic EL device 1 having the above-described configuration. It is to be noted that the following assumptions are taken in the experiment.

(i) The organic EL device having only the light emitting element 2B corresponding to blue is used for the experiment in practice. That is to say, various components (for example, first electrode layers 18R and 18G) corresponding to each of red and green as shown in FIG. 1 and the like are not manufactured and not subjected to the experiment.

(ii) The reflection layer 12 is made of APC, and the thickness thereof is 100 nm. Note that the APC is an alloy made of Ag, Pd, and Cu (Pd is 0.9 wt %, Cu is 1 wt %, the balance is Ag).

(iii) The first electrode layer 18 is made of ITO. The thickness of the first electrode layer 188 corresponding to blue is 30 nm. Based on the above item (i), there is only the first electrode layer 18B corresponding to blue as the first electrode layer 18.

(iv) The entire thickness of the light emitting functional layer 20 is 181 nm. The entire thickness of the light emitting functional layer 20 includes the thickness of the hole injecting layer which is 100 nm, the thickness of the hole transporting layer which is 20 nm, the thickness of the light emitting layer which is 20 nm, the thickness of the electron transporting layer which is 40 nm, and the thickness of the electron injecting layer which is 1 nm. In accordance with the above item (i), since only the experimental result corresponding to blue is shown, the light emitting layer mentioned here is formed by doping a blue dopant material BD-102 (manufactured by Idemitsu Kosan Co., Ltd.) on a host material BH-215 (manufactured by Idemitsu Kosan Co., Ltd.).

(v) The second electrode layer 22 is made of MgAg. The thickness thereof is 10 nm.

(vi) The entire thickness of the reflection enhancing layer 23 is 215 nm. The entire thickness of the reflection enhancing layer 23 includes the thickness of the first high refractive index layer 231 which is 70 nm, the thickness of the low refractive index layer 232 which is 75 nm, and the thickness of the second high refractive index layer 233 which is 70 nm. Further, the first and second high refractive index layers 231 and 233 are made of Alq3, and the low refractive index layer 232 is made of LiF.

FIG. 3 is a result obtained by actually measuring a spectrum of light output from the light emitting element 2B corresponding to blue to the outside of the device on the assumptions of the above items. In FIG. 3, a solid line indicates a result reflecting the above assumptions as they are and a dashed line indicates a comparative example thereof. The comparative example is a result obtained by performing the same experiment for the light emitting element when the reflection enhancing layer 23 according to the embodiment is not provided (see, the above item (vi)). It is to be noted that the solid line in FIG. 3 is referred to as a blue curve Bp and the dashed line in FIG. 3 is referred to as a blue/comparative curve Bp'.

At first, the improvement effect of color purity is achieved at a certain degree in both of the curves (Bp, Bp') in FIG. 3. The reason is that a resonator which includes the reflection layer 12, the first electrode layer 18, the light emitting functional layer 20, and the second electrode layer 22 is formed and the above expression (1) is satisfied for the resonator in the organic EL device 1 according to the embodiment, as is already described.

As shown in FIG. 3, sharpness of the peak is increased as is obvious from the change from the blue/comparative curve Bp' to the blue curve Bp. That is, a half-value width is decreased. Further, as shown in FIG. 4, improvement effect of normalized external quantum efficiency is increased in the experimental example in comparison with the comparative example.

Further, as shown in FIG. 4, coordinate values of "blue" in the experimental example and "blue" in the comparative example on the chromaticity diagram are different from each other.

Figure 5:
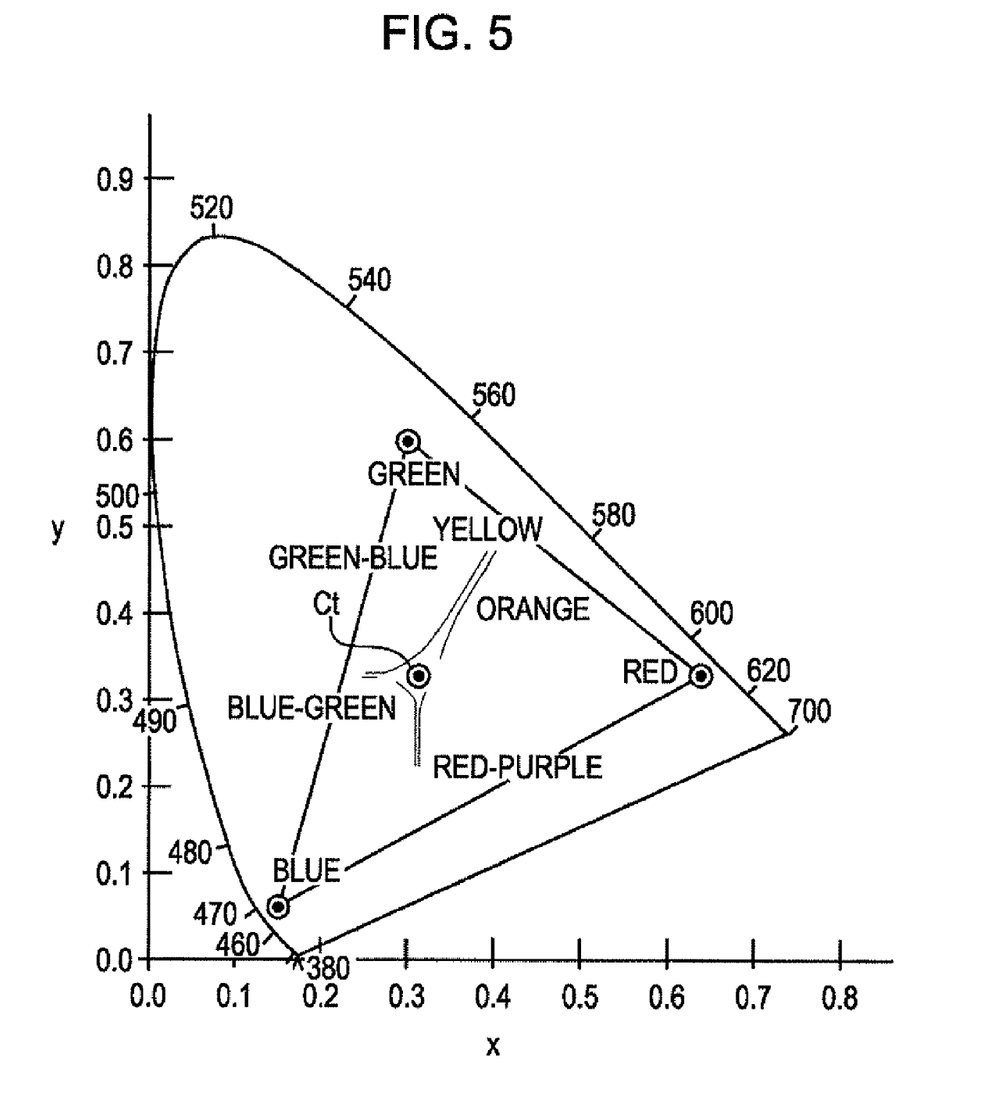
FIG. 5 is a chromaticity diagram.

FIG. 5 is a so-called xy chromaticity diagram. In FIG. 5, a region surrounded by a substantially shell form indicates a range of colors (color region) which can be recognized by human. Color saturation increases toward edges of the region from the center. Further, in FIG. 5, numerical values around the region represent hues. On the other hand, a region surrounded by a triangle within the above region represents a color gamut which can be represented by an RGB color system. A point with a reference symbol Ct indicates a white point. Characters such as "red", "green", and the like marked in FIG. 5 represent general color names which a viewer judges when the viewer recognizes the colors at the positions marked with the characters. For example, when a viewer recognizes a color around a position of x=0.2 and y=0.1, it is highly probable that the viewer judges the color to be "blue". In FIG. 5, chromaticity or tint is represented within the shell form or the triangular form in a so-called pure manner (in other words, in a state where there is not influence by brightness).

Figure 6:
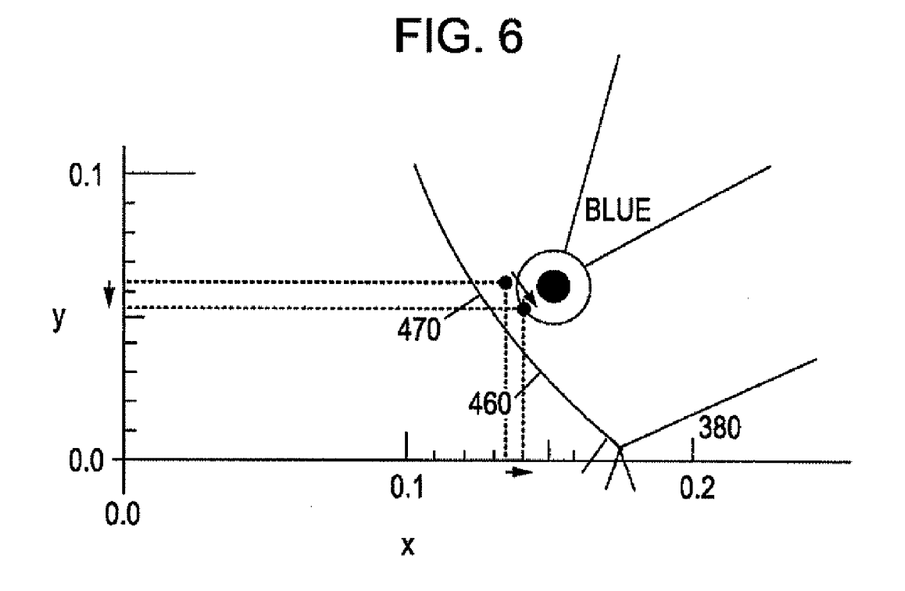
FIG. 6 is a diagram representing the improvement effect of the color purity in FIG. 4 on the chromaticity diagram in FIG. 5.

As for "blue" in the experimental example, a value in the x coordinate increases while a value in the y coordinate decreases in comparison with those in the comparative example (see, FIG. 4). FIG. 6 is a graph in which a region in the vicinity of "blue" in FIG. 5 is enlarged. As shown by an arrow in FIG. 6, it is obvious that color purity of blue is improved in the experimental example.

Various changes as described above are related to the above difference point between the experimental example and the comparative example, that is, presence/absence of the reflection enhancing layer 23.

Figure 7:
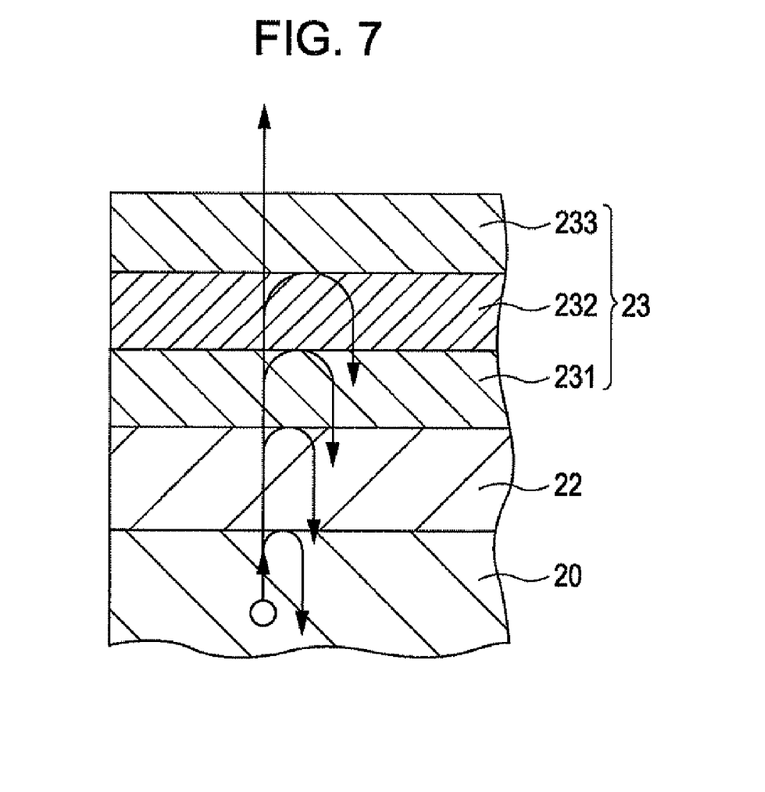
FIG. 7 is a view for explaining an action of a reflection enhancing layer.

As described above, in the organic EL device 1 according to the embodiment, a resonator in which the above expression (1) is satisfied is formed. In order to effectively draw out the function of the resonator, it is preferable that a so-called absolute amount of the light relating to the resonance phenomenon be increased. From the viewpoint, in the embodiment, light emitted from the light emitting functional layer 20 is strongly reflected by an interface of the light emitting functional layer 20 and the second electrode layer 22 made of an alloy or the like at first. Thereafter, the light is strongly reflected by an interface between the second electrode layer 22 and the first high refractive index layer 231, an interface between the first high refractive index layer 231 and the low refractive index layer 232 and an interface between the low refractive index layer 232 and the second high refractive index layer 233 as shown in FIG. 7. That is, an amount of light returned into the resonator is increased. The reason is that refractive indexes change between these interfaces from the layers having higher refractive index to the layers having lower refractive index, or vice versa. The results as shown in FIG. 3, FIG. 4, and FIG. 6 are based on the reason.

Figure 8:
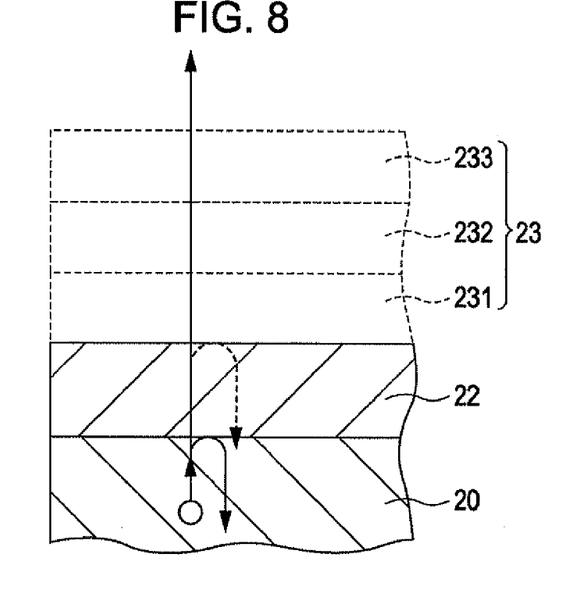
FIG. 8 is a view illustrating a comparative example (in which the reflection enhancing layer is not provided) of FIG. 7.

On the other hand, when the reflection enhancing layer 23 is not provided, light is strongly reflected by the interface between the light emitting functional layer 20 and the second electrode layer 22 as shown in FIG. 8. However, since there is no layer which has a relatively high refractive index in comparison with that of the second electrode layer 22 above the second electrode layer 22, even if reflection is caused, the reflection is significantly weak (see, a dashed line arrow in FIG. 8). That is, an amount of light returned into the resonator is smaller than that in the embodiment.

According to the embodiment, various effects as shown in FIG. 3, FIG. 4, and FIG. 6 are obtained as described above.

In the above experimental example, the organic EL device having only the light emitting element 2B which emits blue light is described. Note that in the organic EL device, the assumptions of the above items (i) through (vi) (in particular, (i)) are set. However, it is needless to say that the invention is not limited to the above assumptions. The same operation effect as those described above can be obtained in the organic EL device having the light emitting elements 2R and 2B which emit red light and green light, respectively in addition to the light emitting element 2B which emits the blue light as shown in FIG. 1. Further, the reflection enhancing layer 23 according to the embodiment and the layers (231, 232, and 233) forming the reflection enhancing layer 23 (in particular, the thicknesses thereof) can be made common for all of the colors even when the light emitting elements 2R, 2G, and 2B corresponding to each color are manufactured.

The embodiment according to the invention has been described hereinabove. However, the light emitting device according to the invention is not limited to the above form and various modifications can be made.

(1) The preferable thicknesses of the first and second high refractive index layers 231, 233, and the low refractive index layer 232 are set to 50 through 90 nm in the above embodiment. However, the invention is not necessarily limited to the preference values.

The preference values are defined in consideration of easiness of manufacturing of the organic EL device 1, reduction in manufacturing period of time, intensity of transmissive light, transmissive property, and the like. However, there are thicknesses other than the preference values, with which preferable transmissive property can be obtained. In fact, such preferable thicknesses are periodically obtained while setting the preference values to the center (to be more simple, there are various preferable thicknesses such as 200 nm, 330 nm, 460 nm and so on while setting 70 nm to the center, for example. It is needless to say that the preferable thicknesses do not always have such accurate periodicity (130 nm interval in the example), in practice). Accordingly, the thicknesses of the above layers (231, 232, and 233) may be defined in consideration of the above conditions.

Figure 9:
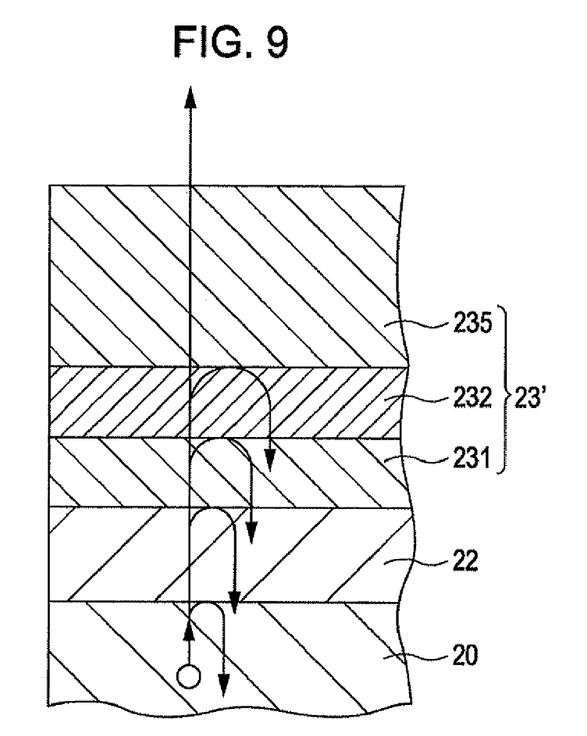
FIG. 9 is a view illustrating an example of a reflection enhancing layer having a second high refractive index layer of a larger thickness.

Particularly in this case, as the thickness of the second high refractive index layer 233 is larger, a sealing function of the second high refractive index layer 233 is enhanced. The sealing function of the second high refractive index layer 233 means a sealing function of preventing at least one of water and oxygen from entering the light emitting element 2. That is to say, the second high refractive index layer 233 in this case has a function of enhancing reflection as described in the above embodiment as well as the sealing function. A reflection enhancing layer 23' including the second high refractive index layer 235 having a thickness larger than the second high refractive index layer 233 in FIG. 7 is illustrated in FIG. 9. In order to achieve the sealing function more desirably, the thickness of the second high refractive index layer 235 is preferably set to equal to or more than 200 nm. If the sealing function is achieved more desirably, water and oxygen can be prevented from entering the light emitting element 2. This leads to an advantage that the element lifetime of the light emitting element 2 is made longer.

As described above, in the invention, thicknesses of the first and second high refractive index layer 231, 233, and the low refractive index layer 232 are not limited to the above preference values. Further, the layers (231, 232, and 233) may be made to have a function other than the reflection enhancement function by appropriately adjusting the thicknesses thereof. With this, the easiness in manufacturing can be increased and cost can be reduced in comparison with a case where different layers having various functions are separately formed.

(2) A case where the light emitting functional layer 20 emits white light is described in the above embodiment. However, the invention is not limited to the mode.

For example, as in the configuration in which the first electrode layers 18R, 18G, and 18B are formed so as to correspond to the color filters 36R, 36G, and 36B in the embodiment, the light emitting functional layer may include light emitting functional layers each of which is dedicated for each of the light emitting element 2R, 2G, and 2B. In this case, the light emitting functional layers are separated into a light emitting functional layer which emits red light, that which emits green light and that which emits blue light. For such light emission of each color, it is sufficient that an organic EL substance contained in each of the light emitting functional layer is appropriately changed. Further, in order to manufacture the organic EL element with such configuration in practice, an ink jet method (liquid droplet ejecting method) or the like may be employed, for example.

(3) Relating to the above item (2), although the color filter panel 30 which is opposed to the light emitting panel 3 is provided sandwiching the adhesive agent 28 therebetween in the above embodiment, it is not essential that the color filter panel 30 being provided regardless of a case where the light emitting functional layer emits only white light or a case where the light emitting functional layers emit each color of lights in the invention.

Relating to such a case further, even in the configuration, light exiting the second high refractive index layer 233 may also be strongly reflected by the interface thereof when the light exits by employing the following configuration.

Figure 10:
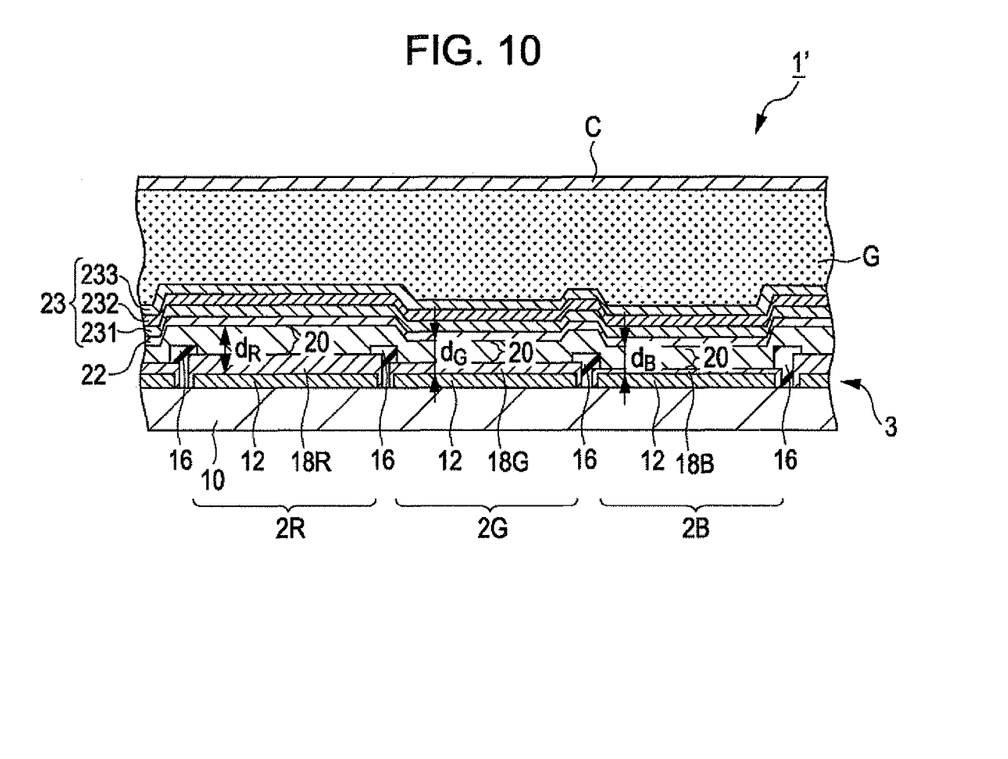
FIG. 10 is a cross-sectional view illustrating a schematic configuration of a light emitting device according to a modification (second) of the embodiment of the invention.

That is, for example, in a case where the entire organic EL device 1' is sealed within a space surrounded by a wall face C made of an appropriate material such as a glass (or resin material, metal), a configuration in which inert gas G which is contained in the space in a sealed manner plays a role equivalent to the low refractive index layer 232 in the above embodiment may be employed. Namely, in this mode, configurations of the layers located at the lower side of the second high refractive index layer 233 in FIG. 10 are the same as those in the above embodiment. However, there is no layer located at the upper side of the second high refractive index layer 233, as shown in FIG. 10. The inert gas G under the wall face C is in contact with the upper surface of the second high refractive index layer 233 in FIG. 10. As the inert gas G, $N_2$ gas, argon gas, and the like can be specifically exemplified. In this case, a refractive index of the inert gas G is smaller than that of the second high refractive index layer 233.

Figure 11:
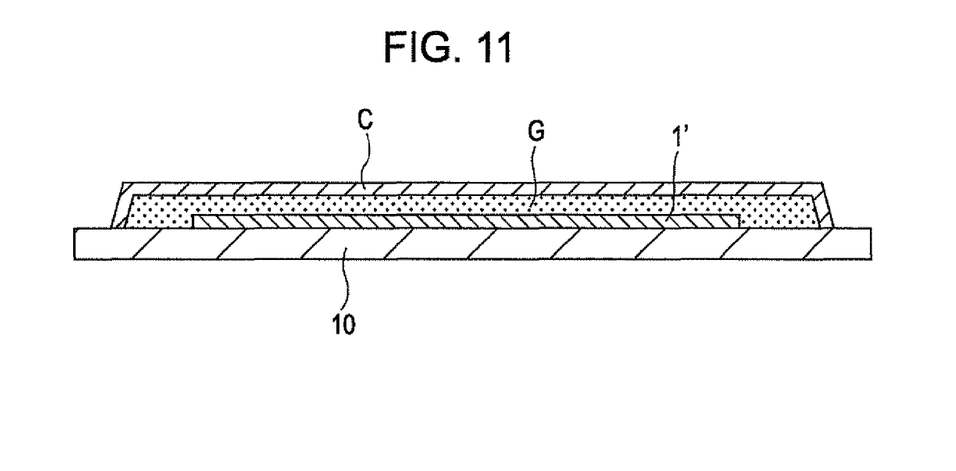
FIG. 11 is a cross-sectional view illustrating a configuration when the entire light emitting device in FIG. 10 is schematically observed.

It is obvious that an operation effect which is not essentially different from that obtained in the above embodiment can be obtained with the mode as shown in FIG. 10 and FIG. 11. That is, in the mode, light incident from the side of the reflection layer 12 is reflected by an interface between the inert gas G and the second high refractive index layer 233 with high possibility. Therefore, it can be expected that an amount of light relating to the resonance phenomenon increases.

Application

Next, electronic devices to which the light emitting device according to the invention is applied are described.

Figure 12:
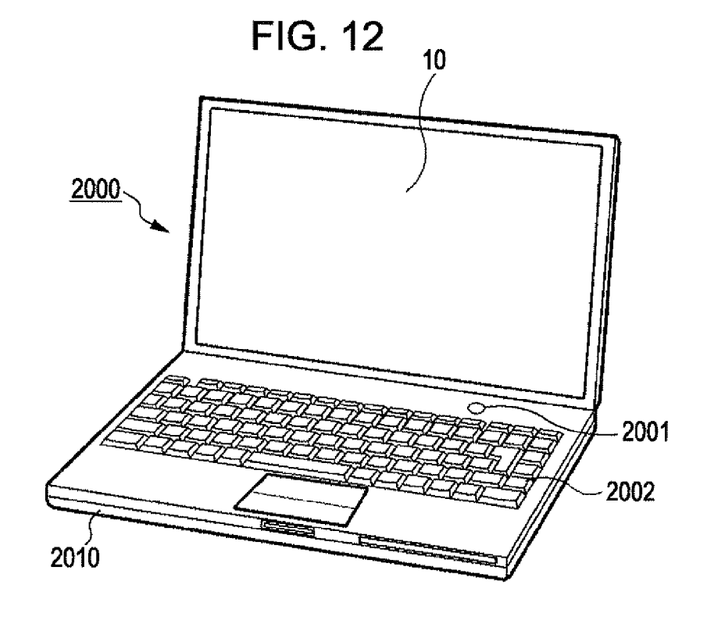
FIG. 12 is a perspective view illustrating an electronic device to which the light emitting device according to the invention is applied.

FIG. 12 is a perspective view illustrating a configuration of a mobile personal computer in which the light emitting device according to the above embodiment is employed for an image display apparatus. A personal computer 2000 includes the organic EL device 1 serving as a display apparatus and a main body portion 2010. A power switch 2001 and a keyboard 2002 are provided on the main body portion 2010.

Figure 13:
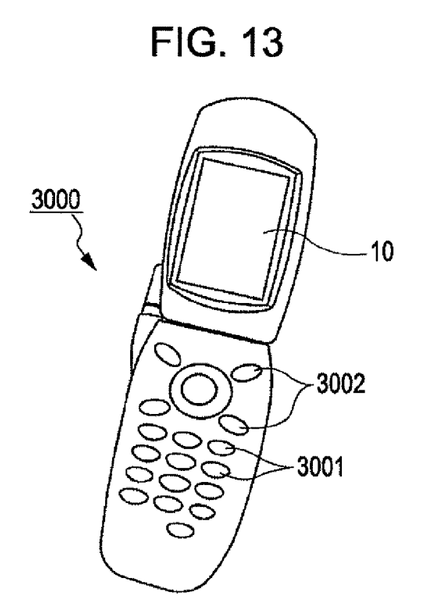
FIG. 13 is a perspective view illustrating another electronic device to which the light emitting device according to the invention is applied.

FIG. 13 illustrates a mobile phone to which the light emitting device according to the above embodiment is applied. A mobile phone 3000 includes a plurality of operation buttons 3001, scroll buttons 3002, and the organic EL device 1 serving as a display apparatus. When the scroll buttons 3002 are operated, a screen displayed on the organic EL device 1 is scrolled.

Figure 14:
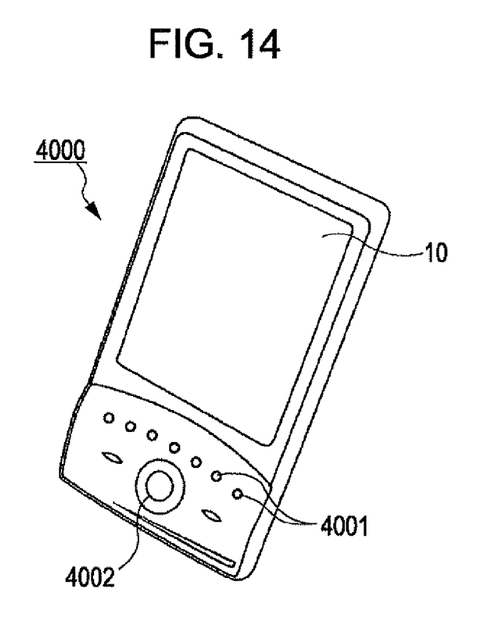
FIG. 14 is a perspective view illustrating still another electronic device to which the light emitting device according to the invention is applied.

FIG. 14 illustrates a Personal Digital Assistant (PDA) to which the light emitting device according to the above embodiment is applied. A personal digital assistant 4000 includes a plurality of operation buttons 4001, a power switch 4002, and the organic EL device 1 serving as a display apparatus. When the power switch 4002 is operated, various pieces of information such as an address book and a schedule book are displayed on the organic EL device 1.

As electronic devices to which the light emitting device according to the invention is applied, a digital still camera, a television, a video camera, a car navigation system, a pager, an electronic organizer, an electronic paper, a calculator, a word processor, a workstation, a video phone, a POS terminal, a video player, a device equipped with a touch panel, and the like are exemplified in addition to the electronic devices as shown in FIG. 12 through FIG. 14.

The entire disclosure of Japanese Patent Application No. 2009-244177, filed Oct. 23, 2009 is expressly incorporated by reference herein.

What is claimed is:

1. A light emitting device comprising:
a light emitting element having a first electrode layer, a second electrode layer, and a light emitting functional layer disposed between the first electrode layer and the second electrode layer above a substrate;
a reflection layer which is disposed between the substrate and the first electrode layer and reflects light emitted by the light emitting functional layer toward the light emitting functional layer;
a semi-transparent semi-reflective layer which is disposed above the light emitting functional layer and reflects a portion of light emitted by the light emitting functional layer toward the light emitting functional layer, and transmits the other portion of the light; and
a reflection enhancing layer which is disposed on the semi-transparent semi-reflective layer and includes a first layer having a refractive index higher than a refractive index of the semi-transparent semi-reflective layer,
wherein the first layer is in contact with the semi-transparent semi-reflective layer.

2. The light emitting device according to claim 1,
wherein the semi-transparent semi-reflective layer includes the second electrode layer and functions as a cathode.

3. An electronic device comprising a light emitting device according to claim 2.

4. The light emitting device according to claim 1,
wherein the reflection enhancing layer includes: in addition to the first layer,
a (2n)th layer having a refractive index lower than a refractive index of the first layer (n is a positive integer); and
a (2n+1)th layer having a refractive index higher than a refractive index of the (2n)th layer, a second layer in the (2n)th layer is in contact with the first layer, and the (2n)th layer is in contact with the (2n+1)th layer.

5. An electronic device comprising a light emitting device according to claim 4.

6. The light emitting device according to claim 1, wherein an optical distance from the reflection layer to an interface of the semi-transparent semi-reflective layer, which is opposed to the reflection layer, is defined based on "d" calculated from an expression (i), $$d=((2pm+jD+jU)/4p)\cdot 1 \tag{i}$$

in which 1 indicates a wavelength set as a resonance subject, jD indicates a phase change when light having the wavelength 1 traveling from the side of the light emitting functional layer toward the reflection layer is reflected by the reflection layer, jU indicates a phase change when light having the wavelength 1 traveling from the side of the light emitting functional layer toward the semi-transparent semi-reflective layer is reflected by the semi-transparent semi-reflective layer, and m is a positive integer.

7. An electronic device comprising a light emitting device according to claim 6.

8. An electronic device comprising a light emitting device according to claim 1.

* * * * *